United States Patent [19]

Aldinger

[11] Patent Number: 4,748,401
[45] Date of Patent: May 31, 1988

[54] METHOD AND APPARATUS FOR RECOGNIZING THE POLARITY OF POLARIZED CAPACITORS

[75] Inventor: Ulrich Aldinger, Munich, Fed. Rep. of Germany

[73] Assignee: Siemens Aktiengesellschaft, Berlin and Munich, Fed. Rep. of Germany

[21] Appl. No.: 6,904

[22] Filed: Jan. 27, 1987

[30] Foreign Application Priority Data

Aug. 1, 1986 [DE] Fed. Rep. of Germany ....... 3626036

[51] Int. Cl.$^4$ .................... G01R 27/26; G01R 27/00
[52] U.S. Cl. .................. 324/61 R; 324/60 C; 324/60 CD; 209/574
[58] Field of Search ................. 324/61 R, 60 R, 60 C, 324/60 CD, 133; 209/574; 307/127

[56] References Cited

U.S. PATENT DOCUMENTS 3,534,853 10/1970 Seaman ................ 209/574

FOREIGN PATENT DOCUMENTS 3213110 10/1983 Fed. Rep. of Germany .... 324/61 R

OTHER PUBLICATIONS

Roop et al., Reverse Capacitor Tester, IBM Technical Disclosure Bulletin, vol. 26, No. 2, Jul. 1983, pp. 579–581.

Primary Examiner—Reinhard J. Eisenzopf
Assistant Examiner—Jack B. Harvey
Attorney, Agent, or Firm—Hill, Van Santen, Steadman & Simpson

[57] ABSTRACT

For recognizing the polarity of polarized capacitors, the capacitors are charged to a prescribable positive voltage or to a prescribable negative voltage of equal magnitude once with a constant positive direct current and once with a constant negative direct current of the same magnitude. The times respectively required for charging and/or discharging the capacitor are measured. Since the capacitor is charged and/or discharged faster given correct poling than given incorrect poling, the polarity of the capacitor can be determined from the difference between the measured times. In particular, the polarity of tantalum or aluminum electrolytic capacitors in automatic equipping of printed circuitboards or ceramic substrates can be recognized with the method.

6 Claims, 1 Drawing Sheet

METHOD AND APPARATUS FOR RECOGNIZING THE POLARITY OF POLARIZED CAPACITORS

CROSS REFERENCE TO RELATED APPLICATION

This application is related to application Ser. No. 07/007485 filed Jan. 28, 1987.

BACKGROUND OF THE INVENTION (1.) Field of the Invention

The present invention relates to a method for recognizing a polarity of polarized capacitors, particularly of tantalum and aluminum electrolytic capacitors in the automatic equipping of printed circuitboards and ceramic substrates, and is also related to an apparatus for implementation of the method.

(2.) Description of the Prior Art

In the automatic equipping of printed circuitboards and ceramic substrates with electronic components, such as resistors, capacitors, diodes, transistors, chips and the like, the various components are offered in laterally arranged feeder devices. The removal of the component then occurs via an equipping head which grasps the respective component offered in a removal position, centers the component with the assistance of four forceps-like levers arranged in pairs, and deposits the component on a predetermined location of the printed circuitboard or of the ceramic substrate. The equipping reliability obtainable with such automatic equipping units known, for example, from U.S. Pat. No. 4,135,630, fully incorporated herein by this reference, critically depends on the equipping head program for the removal position of the feeder devices always encountering the components in the proper position and likewise depositing the components in the proper position in the programmed equipping position of the printed circuitboard or of the ceramic substrate.

In the equipping head disclosed in the German application No. A 3 102 206, at least the lower end of the suction pipette serving the purpose of picking up the components is composed of an electrically nonconductive material, whereby the forceps-shaped ends of the levers interacting with the electronic component are arranged in an electrically insulated fashion. As a result of this measure, a defined current can be supplied via a pair of levers or a defined voltage can be applied via a pair of levers. In particular, there is the possibility of measuring or, respectively, testing the electrical characteristics of the component respectively seized by the equipping head. However, a recognition of the polarity of polarized capacitors that is absolutely necessary for automatic equipping is not possible with this equipping head since suitable electrical recognition methods have been heretofore unknown.

SUMMARY OF THE INVENTION

The object of the present invention is to provide a method for recognizing the polarity of polarized capacitors which, in particular enables a simple and reliable polarity recognition of tantalum and aluminum electrolytic capacitors in the automatic equipping printed circuitboards or ceramic substrates.

This object is achieved, according to the present invention, in that the capacitor to be tested is charged to a prescribable positive voltage or to a prescribable negative voltage of the same magnitude, being charged thereto, first of all, with a constant direct current of the one direction and, secondly, the constant direct current of the same magnitude and of the opposite direction, in that the respective times required for charging and/or discharging the capacitor are measured, and in that a conclusion regarding the poling of the capacitors is drawn from the difference between the measured times.

The present invention is based on the perception that a smaller capacitance is measured given a correct poling of electrolytic capacitors than is measured given a incorrect poling. This is to be attributed to the fact that the dielectric composed of a metal oxide layer is strengthened by oxygen absorption given a correct poling, whereas a weakening occurs due to oxygen withdrawal given an incorrect poling. The reduction in the strength of the dielectric layer then necessarily leads to a higher capacitance. Accordingly, the capacitor is charged about 1% faster given correct poling of the capacitor in comparison to an incorrect poling. In the same manner, the capacitor is discharged about 1% faster given correct poling in comparison to incorrect poling. Although the differences in the times required for charging and/or discharging given correct and incorrect poling are slight, absolutely reliable information concerning the polarity of the tested capacitors can be acquired by comparing these two time measurements.

According to a further feature of the invention, a positive voltage of +0.5 volts and a negative voltage of −0.5 volts are prescribed for the charging of the capacitor. It was thereby taken into consideration that the voltage to which the capacitor is charged should be as high as possible in order to achieve the clearest possible information regarding the polarity. On the other hand, it was also taken into consideration in this dimensioning that the polarized capacitors are destroyed when specific, maximum pole-reversing voltages are exceeded. Given tantalum electrolytic capacitors, the maximally-allowed pole-reversing voltages amount to 0.15 $U_{Nenn}$ at 20° C. and 0.05 $U_{Nenn}$ at 80° C., whereby the maximally allowable pole-reversing voltage given aluminum electrolytic capacitors amounts to 2 volts. Since the charging of the capacitors to ±0.5 volts is undertaken at room temperature, the polarity recognition is certain not to lead to any damage of the capacitors.

An apparatus for the implementation of the method of the invention that is particularly reliable and constructed in a particularly simple manner is characterized in that the outputs of a constant current source for feeding a constant direct current of the one direction or a constant direct current of the same magnitude of the other direction are connectible to the capacitor to be tested, and in that the times for charging and/or discharging the capacitor to a prescribable positive voltage or a prescribable negative voltage of the same magnitude can be acquired with a time measuring device.

In accordance with a preferred embodiment of the apparatus of the present invention, it is provided that the time measuring device is formed by a counter controllable by three comparators. Particularly accurate time measurements of the charging events and/or discharging events are enabled with such a combination of comparators and counters.

BRIEF DESCRIPTION OF THE DRAWING

Other objects, features and advantages of the invention, its organization, construction and mode of operation will be best understood from the following detailed description taken in conjunction with the accompanying drawing, on which.

DESCRIPTION OF THE PREFERRED EMBODIMENTS

Figure 1:
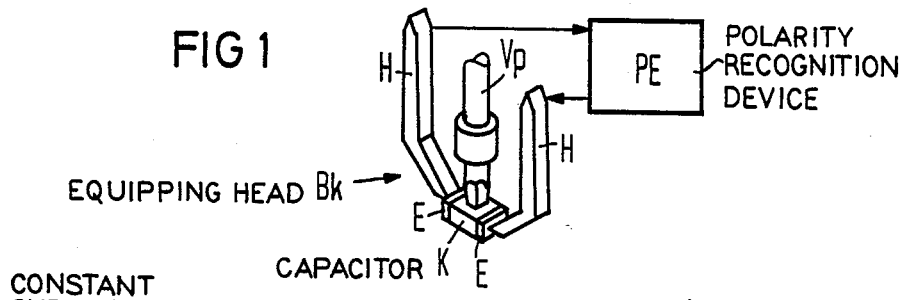
FIG. 1 is a fragmentary illustration of an equipping head having a polarized capacitor and a polarity recognition apparatus.

FIG. 1 illustrates a capacitor K seized by an equipping head Bk of an automatic equipping unit. Only a vacuum pipette Vp and two of the total of four levers H provided for centering the components are seen of the equipping head Bk.

The capacitor K illustrated in FIG. 1 is a polarized capacitor constructed as an SMD component, for example a tantalum electrolytic capacitor. Accordingly, one of the end face electrodes E has the positive pole assigned thereto and the other electrode E has the negative pole assigned thereto. Since the polarity of the capacitor K indicated by a "+" printed only on one side cannot be recognized by the automatic equipping unit, the equipping head has a polarity recognition device PE assigned thereto. This polarity recognition device is thereby connected to those two levers H whose forcep-like ends contact the electrodes E of the polarized capacitor K picked up by the equipping head Bk.

Figure 2:
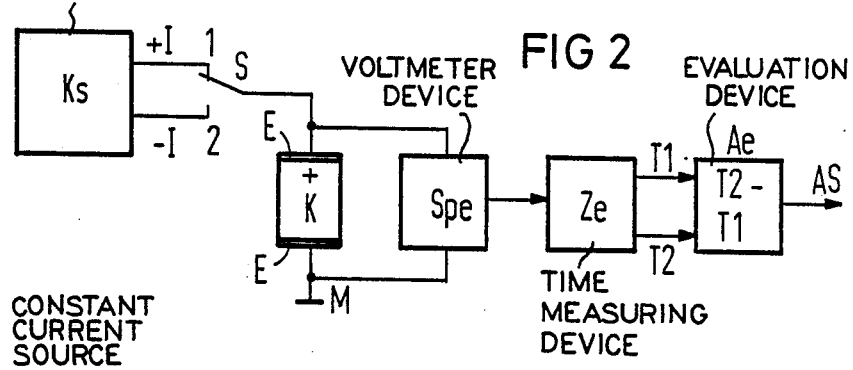
FIG. 2 is a schematic diagram illustrating the principle of polarity recognition.

FIG. 2 illustrates the principle of the present invention concerning polarity recognition in a greatly simplified, schematic illustration. A constant current source Ks generates a constant current +I of the one current direction and a constant current −I of the other current direction and of equal magnitude. The constant current +I or −I is fed into the capacitor K dependent on the position of a switch S, the electrodes of the capacitor K being connected to the switch S or, respectively, to ground end. In the position 1 of the switch S shown in FIG. 2 the "positive" constant current +I is fed into the capacitor K to be measured. A voltmeter device Spe is connected in parallel with the capacitor K and switches a following time measuring device Ze on with the beginning of the charging operation. As soon as the capacitor is charged to a positive voltage +U of +0.5 volt, the voltmeter device Ze shuts off the time measuring device Ze, whereby the time measured for the charging event is referenced T1.

In the position 2 of the switch S, the "negative" constant current −I is then fed into the capacitor to be measured. After previous discharging of the capacitor K, the voltmeter device Spe switches the time-measuring device Ze on with the beginning of the renewed charging event. As soon as the capacitor has then been charged to the negative voltage −U of −0.5 volts, the voltmeter device Spe switches the time measuring device Ze off again, whereby the time measured for this charging event is referenced T2.

The two measured times T1 and T2 are supplied to an evaluation device Ae which generates an output signal AS corresponding to the difference T2−T1, the output signals AS being representative of the polarity of the respective capacitor K and is supplied, for example, to the computer of the automatic equipping unit.

Based on the perception that polarized capacitors K are charged faster given correct poling than given incorrect poling, it then derives for the case shown in FIG. 2 that a correct poling can be assumed given T1<T2, whereas T1>T2 indicates an incorrect poling of the capacitor.

In accordance with FIG. 2, the upper electrode E of the capacitor K is labeled "+", whereby the automatic equipping unit, however, cannot recognize this identification of the polarity. However, the automatic equipping unit is informed of the correct polarity by the output signal AS=T2−T1 In the case illustrated here, T1<T2 applies, i.e. the positive value of the output signal As indicates that the capacitor K exhibits the correct polarity with the shorter charging time in the position 1 of the switch S. Since a "positive" current +I is supplied to the upper electrode of the capacitor K in FIG. 2 in the position 1 of the switch S, it follows that the upper electrode E has the positive pole assigned thereto and that the lower electrode E has the negative pole assigned thereto.

Figure 3:
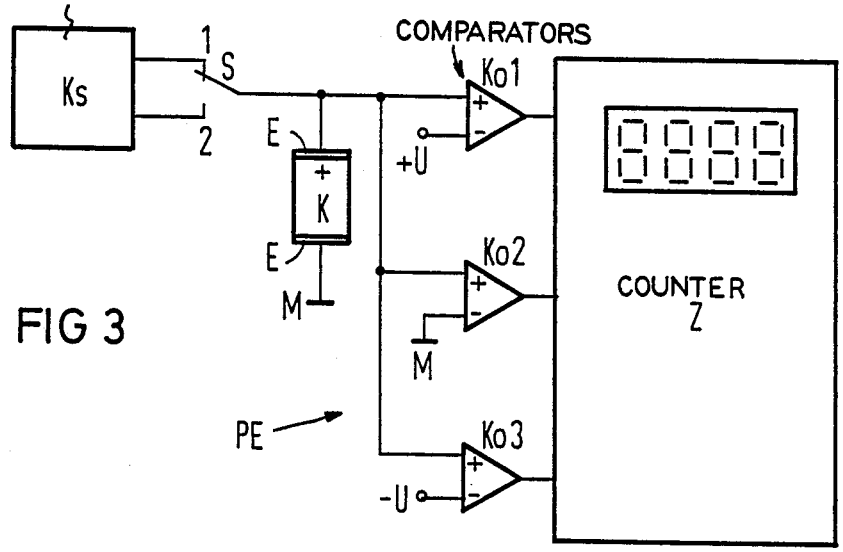
FIG. 3 is a schematic diagram illustrating the fundamental structure of the polarity recognition apparatus illustrated in FIG. 1.

FIG. 3 illustrates the structure of the polarity recognition device PE shown in FIG. 1, whereby the arrangement of a constant current source Ks and of the capacitor K corresponds to the arrangement already shown in FIG. 2. The switch S or, respectively, the upper electrode E is connected to the positive inputs of the comparators Ko1, Ko2 and Ko3. A voltage of +0.5 volts is applied to the negative input of the comparator Ko1 as referenced a voltage +U. The negative input of the comparator Ko2 is applied to ground M, i.e. the reference voltage here amounts to zero volts. A voltage of −0.5 volts is applied to the negative input of the comparator Ko3 as a reference voltage −U. The outputs of the three comparators Ko1, Ko2 switches on the counter Z at the beginning of the charging event given a discharged capacitor K. As soon as the capacitor K is charged to +0.5 volts, the comparator Ko1 then switches the counter Z off again. After the switch S has switched into the position 2, the comparator Ko2 again switches the counter Z on at the beginning of the renewed charging event given a discharged capacitor K. As soon as the capacitor K is charged to −0.5 volts, the comparator Ko3 then switches the counter Z off again. Afterwards, the counter Z identifies the charging times referenced T1 and T2 in FIG. 2. However, the discharge times could be additionally consulted for the measurement or could even by the only information consulted. The further evaluation of the times identified with the counter Z can be undertaken in the manner already set forth in conjunction with FIG. 2.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for recognizing the polarity of an electrolytic capacitor, comprising the steps of:
    (a) charging the capacitor with a first constant current of a first direction to a first predetermined voltage of a first polarity while simultaneously measuring the charging time as a first charging time;

(b) discharging the capacitor;
(c) charging the capacitor with a second constant current of a second direction and equal in magnitude to the first constant current to a second predetermined voltage which is equal to and opposite in polarity to the first predetermined voltage while simultaneously measuring the charging time as a second charging time; and
(d) comparing the two charging times to determine the correct polarity of the capacitor.

2. The method of claim 1, wherein:
the step (a) of charging is further defined as charging the capacitor to a first predetermined voltage of +0.5 volts; and
the step (c) of charging is further defined as charging the capacitor to a second predetermined voltage of −0.5 volts.

3. Apparatus for recognizing the polarity of an electrolytic capacitor, comprising:
a current generator including a first output and a second output and operable to provide a first constant direct current of a first direction at said first output and a second constant direct current of equal magnitude as the first constant direct current and of the opposite direction at said second output;
a switch connected to said capacitor and selectively operable to connect said capacitor to said first and second outputs of said current generator;
sensing means connected to said capacitor for sensing the charging of the capacitor to a first predetermined voltage when said switch is connected to said first output and to an equal and opposite second predetermined voltage when said switch is connected to said second output;
timing means connected to said sensing means and operable to measure the charging times of said capacitor to said first and second predetermined voltages; and
means for comparing the charging times to determine the polarity of the capacitor.

4. The apparatus of claim 3, wherein:
said sensing means comprises first, second and third comparators each including a first input connected to said capacitor, and a second input, said second input of said first comparator connected to a first voltage equal to said first predetermined voltage, said second input of said second comparator connected to a reference potential equidistant between said first and second predetermined voltages, and said second input of said third comparator connected to a second voltage equal to said second predetermined voltage, each of said comparators including an output; and
a counter connected to said outputs of said comparators and operated by said second comparator to start counting at the initiation of the charging the first or second predetermined voltages and respectively turned off by said first comparator and said third comparator upon reaching respective first and second predetermined voltages.

5. A method for recognizing the polarity of an electrolytic capacitor, comprising the steps of:
(a) charging the capacitor with a first constant current of a first direction to a first predetermined voltage of a first polarity;
(b) discharging the capacitor while simultaneously measuring the discharging time as a first discharging time;
(c) charging the capacitor with a second constant current of a second direction and equal in magnitude to the first constant current to a second predetermined voltage which is equal to and opposite in polarity to the first predetermined voltage;
(d) discharging the capacitor again while simultaneously measuring the discharging time as a second discharging time; and
(e) comparing the two discharging times to determine the correct polarity of the capacitor.

6. The method of claim 5, wherein:
the step (a) of charging is further defined as charging the capacitor to a first predetermined voltage of +0.5 volts; and
the step (c) of charging is further defined as charging the capacitor to a second predetermined voltage of −0.5 volts.

* * * * *